United States Patent
Hwang et al.

(10) Patent No.: US 6,266,282 B1
(45) Date of Patent: Jul. 24, 2001

(54) WRITE METHOD OF SYNCHRONOUS FLASH MEMORY DEVICE SHARING A SYSTEM BUS WITH A SYNCHRONOUS RANDOM ACCESS MEMORY DEVICE

(75) Inventors: Seong-Don Hwang, Seoul; Myong-Jae Kim, Suwon, both of (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/373,444

(22) Filed: Aug. 12, 1999

(30) Foreign Application Priority Data

Aug. 13, 1998 (KR) .................................. 98-32937

(51) Int. Cl.$^7$ ............................. G11C 16/04; G06F 12/00
(52) U.S. Cl. .................. 365/185.33; 365/222; 711/103; 711/106
(58) Field of Search ................ 365/185.08, 185.33, 365/222; 711/103, 105–106, 148

(56) References Cited

U.S. PATENT DOCUMENTS

| | | | |
|---|---|---|---|
| 5,197,026 | * 3/1993 | Butler | 365/185.08 |
| 5,297,096 | 3/1994 | Terada et al. | 365/218 |
| 5,448,712 | 9/1995 | Kynett et al. | 395/430 |
| 5,586,081 | 12/1996 | Mills et al. | 365/230.08 |
| 5,650,967 | * 7/1997 | Seibert | 365/185.33 |
| 5,696,717 | 12/1997 | Koh | 365/185.22 |
| 5,737,258 | * 4/1998 | Choi et al. | 365/63 |
| 5,745,417 | 4/1998 | Kobayashi et al. | 365/185.29 |
| 5,893,135 | * 4/1999 | Hasbun et al. | 711/103 |

* cited by examiner

*Primary Examiner*—Son Mai
(74) *Attorney, Agent, or Firm*—Marger Johnson & McCollom, P.C.

(57) ABSTRACT

In a system having a synchronous flash memory device which shares a system bus with a synchronous random access memory device, the synchronous random access memory device is set to refresh mode before a program or erase operation is performed in the synchronous flash memory device, thereby preventing the program and erase operations of the synchronous flash memory device from affecting the operation of, or data stored in, the synchronous random access memory device. After the program or erase operation is completed, the synchronous random access memory device is placed back in normal mode.

12 Claims, 7 Drawing Sheets

US 6,266,282 B1

WRITE METHOD OF SYNCHRONOUS FLASH MEMORY DEVICE SHARING A SYSTEM BUS WITH A SYNCHRONOUS RANDOM ACCESS MEMORY DEVICE

This application claims priority from Korean patent application No. 98-32937 filed Aug. 13, 1998 in the name of Samsung Electronics Co., Ltd., which is herein incorporated by reference.

BACKGROUND OF THE INVENTION

1. Field of the Invention

The present invention relates generally to computer systems, and more particularly, to a method for writing to a synchronous flash memory device in a computer system having a synchronous random access memory device sharing a system bus with the synchronous flash memory device.

2. Description of the Related Art

Electrically programmable read-only memories (EPROMs) and electrically erasable and programmable read-only memories (EEPROMs), are used as nonvolatile memory in microcomputers (and microcontrollers). With both types of programmable read-only memories, a complete write operation requires an erase operation and a program operation. With an EPROM, data is erased by projecting ultraviolet light at a particular portion, and then new data is programmed therein. The EPROM must be separated from the circuit board during erasure because the ultraviolet light affects other elements on the board. With the EEPROM, however, data is erased by applying electrical signals to the EEPROM, and then new data is programmed therein.

Since a select transistor is provided in each cell of an EEPROM, the size an EEPROM cell is larger than that of an EPROM cell, so it is difficult to achieve high integration densities with EEPROM cells. To solve this problem, flash memory devices have been developed in which each of the EEPROM cells is configured by means of only one transistor. When a flash memory device is used as a nonvolatile memory in a microcomputer, it must receive and transmit information to and from the exterior of the chip (for example, from a microprocessor, a synchronous random access memory device, etc.) at high speeds. Therefore, flash memory devices, which operate in synchronization with a clock signal, have been developed. Such a synchronous flash memory device is disclosed in U.S. Pat. No. 5,586,081, entitled "SYNCHRONOUS ADDRESS LATCHING FOR MEMORY ARRAYS", which is herein incorporated by reference.

A synchronous flash memory device can be implemented so as to share the same system bus with the synchronous random access memory device under the control of a microprocessor. However, the operation of, or data stored in, the synchronous random access memory device can be affected by a program/erase operation of the synchronous flash memory device.

SUMMARY OF THE INVENTION

It is therefore an object of the present invention to provide a method for writing to a synchronous flash memory device which shares a system bus with a synchronous random access memory device.

To prevent the program and erase operations of a synchronous flash memory device from affecting the operation of, or data stored in, a synchronous random access memory device which shares the system bus, the present invention sets the synchronous random access memory device to refresh mode before a program or erase operation is performed in the synchronous flash memory device. After the program or erase operation is completed, the synchronous random access memory device is placed back in normal mode. If data is to be transferred from the synchronous random access memory device to the synchronous flash memory device, the data is read from the synchronous random access memory device and stored temporarily in the synchronous flash memory device before the synchronous random access memory device is set in refresh mode.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION

Figure 1:
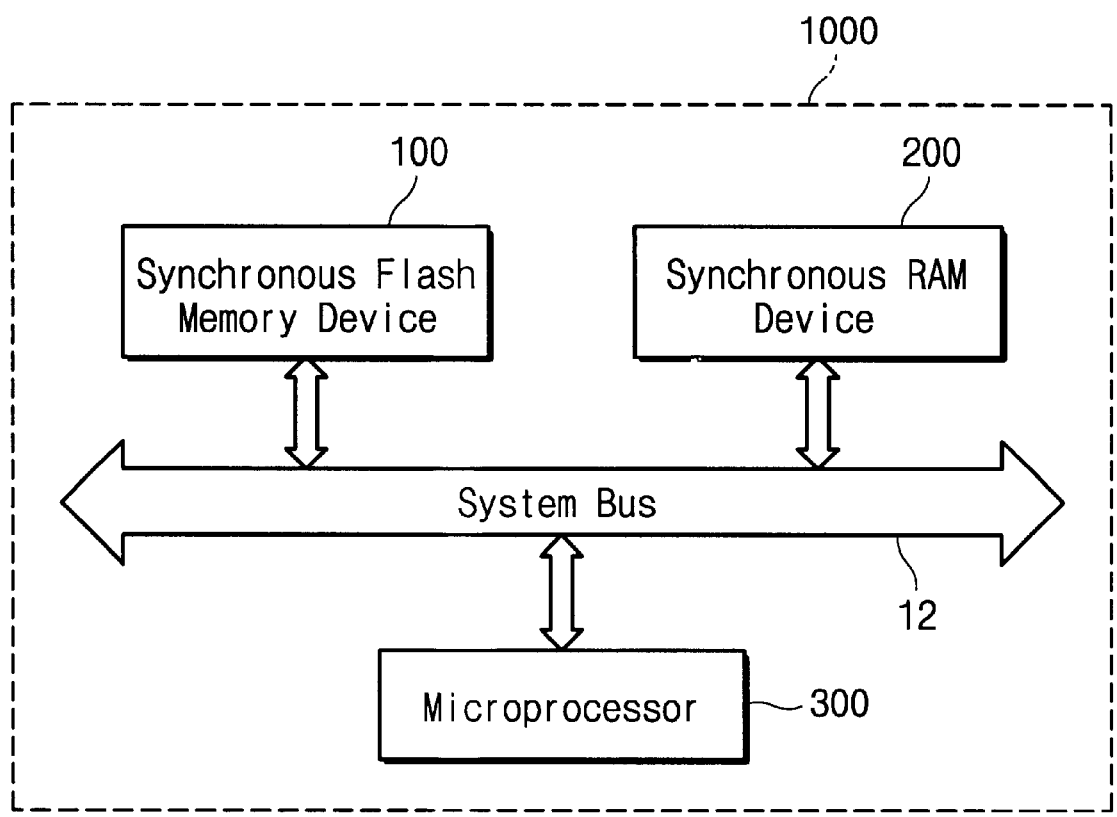
FIG. 1 is a block diagram showing an embodiment of a system according to the present invention.

FIG. 1 is a block diagram showing an embodiment of a system according to the present invention. In FIG. 1, the system 1000 of the present invention includes a synchronous flash memory device 100, a synchronous random access memory device 200, for example, a synchronous dynamic random access memory (SDRAM) device, and a microprocessor 300. The synchronous flash memory device 100 shares a system bus 12 with the SDRAM device 200, and transmits and receives data to and from the microprocessor 300, or to and from the SDRAM device 200 under the control of the microprocessor 300. Herein, the system bus 12 includes plural address lines, plural data lines and plural control lines. According to the system structure of the present invention, a write operation, that is, an erase and program operation, is performed on the synchronous flash memory device after the SDRAM device 200 enters a refresh mode, as will be more fully described below.

Figure 2:
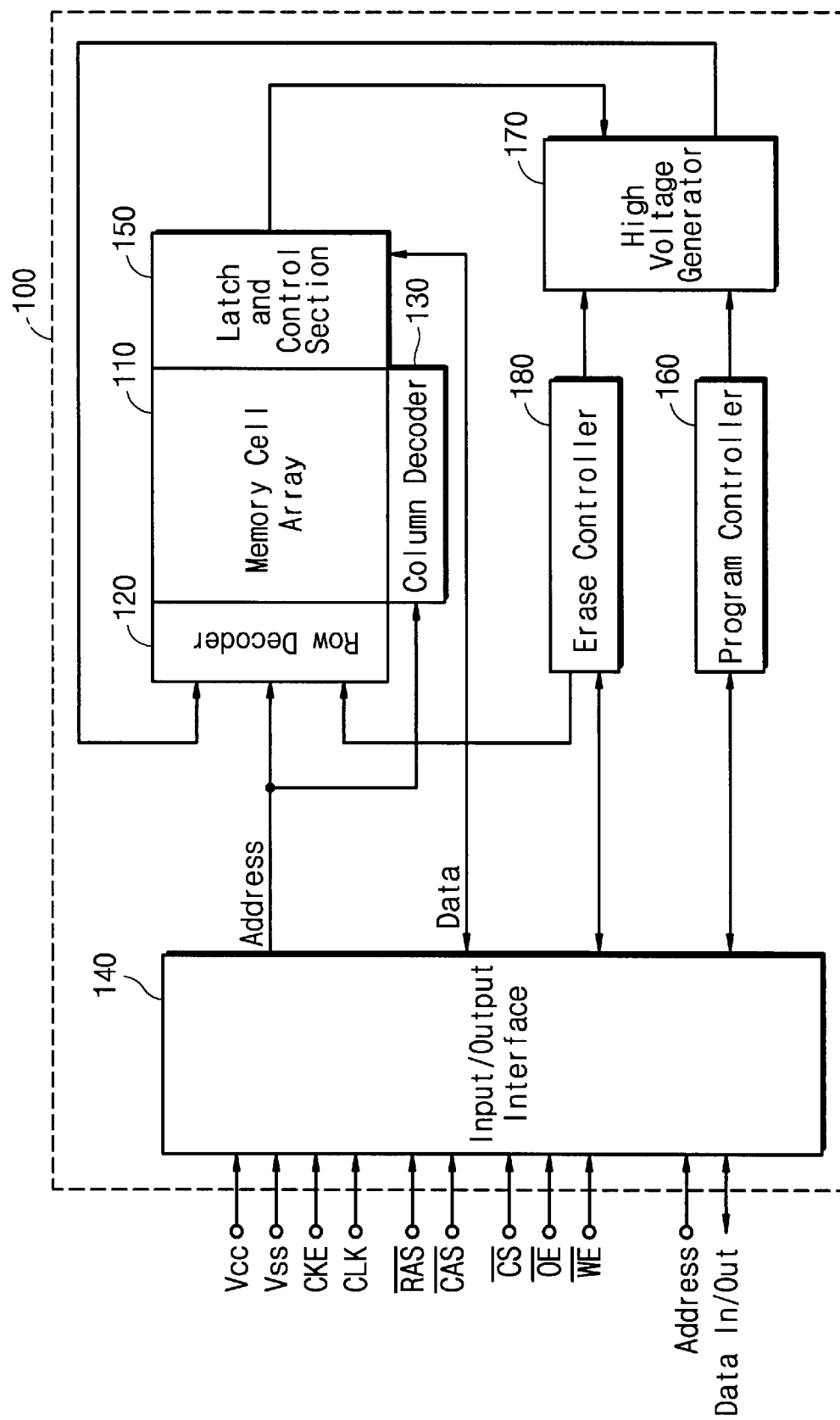
FIG. 2 is a preferred embodiment of the synchronous flash memory device illustrated in FIG. 1.

FIG. 2 is a preferred embodiment of the synchronous flash memory device of FIG. 1 according to the present invention. Referring to FIG. 2, the synchronous flash memory device 100 includes an array 110 of EEPROM cells (or flash memory cells) which have a NOR structure and are arranged at the intersections of word lines and bit lines. One of the EEPROM cells is selected by a row decoder circuit 120 and a column decoder circuit 130 in manner that is well known in the art. Data stored in the selected cell is latched in a latch and control section 150, and then transferred to the system bus 12 via an input/output interface 140. Data to be programmed is temporarily stored in the latch and control section 150 via the input/output interface 140, and then programmed into the selected cell by use of a program voltage which is generated by a high voltage generator 170 under the control of a program controller 160.

Erase, program and read operations are disclosed in U.S. Pat. No. 5,696,717, entitled "NONVOLATILE INTEGRATED CIRCUIT MEMORY DEVICES HAVING ADJUSTABLE ERASE/PROGRAM THRESHOLD VOLTAGE VERIFICATION CAPABILITY", in U.S. Pat. No. 5,448,712, entitled "CIRCUITRY AND METHOD FOR PROGRAMMING AND ERASING A NON-VOLATILE SEMICONDUCTOR MEMORY", in U.S. Pat. No. 5,745,417, entitled "ELECTRICALLY PROGRAMMABLE AND ERASABLE NONVOLATILE SEMICONDUCTOR MEMORY DEVICE AND OPERATING METHOD THEREOF", and in U.S. Pat. No. 5,297,096, entitled "NONVOLATILE SEMICONDUCTOR MEMORY DEVICE AND DATA ERASING METHOD THEREOF", which are herein incorporated by reference.

In the input/output interface 140, although not shown in FIG. 2, a latch is provided for temporarily storing data transferred from the SDRAM device 200 or another device via the system bus 12 under the control of the microprocessor 300 of FIG. 1. In order to receive and transmit data at high speeds together with the SDRAM device 200, the synchronous flash memory device 100 has to share the system bus 12 with the SDRAM device 200.

In this embodiment, the operation of, or data stored in, the SDRAM device 200 is not affected by the program and erase operations of the synchronous flash memory device 100. To accomplish this, first, second and third preferred embodiments of the present invention will be described below.

First Embodiment

Figure 3:
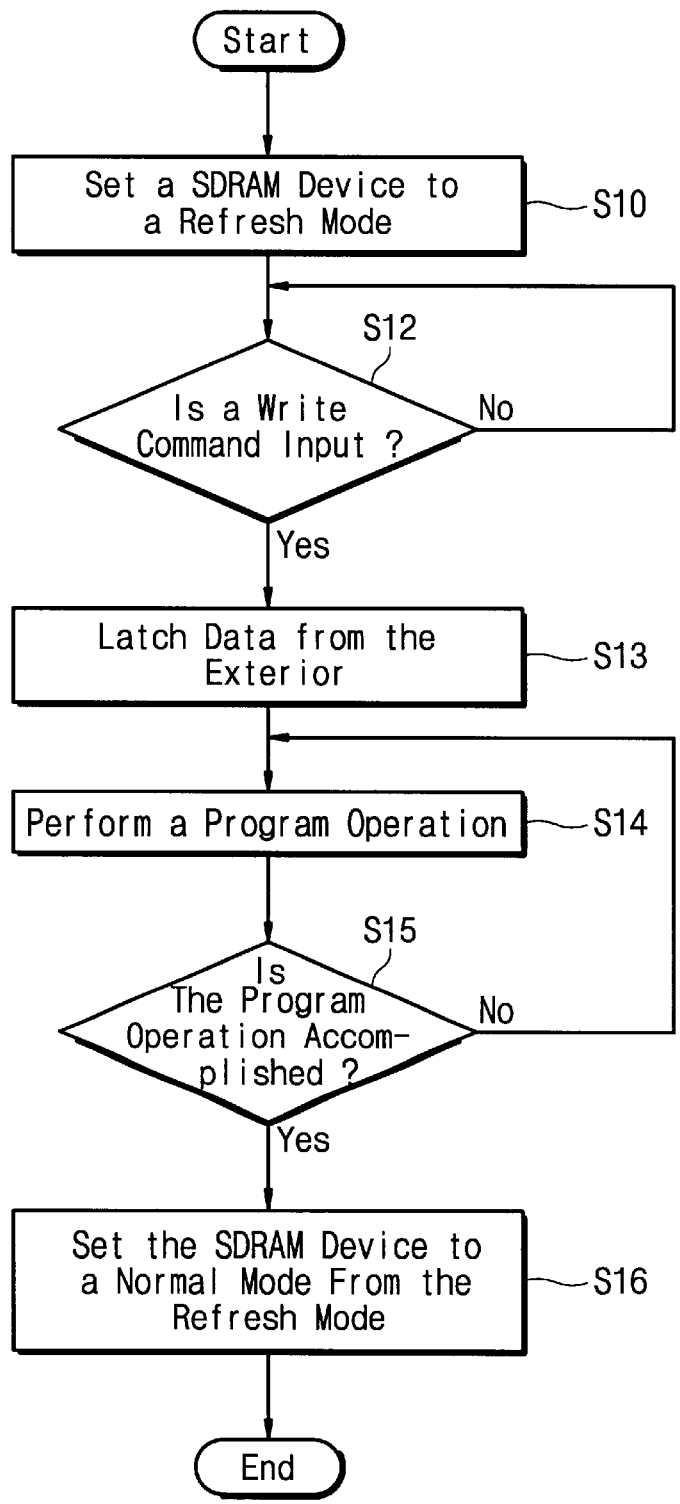
FIG. 3 is a flowchart for describing a program operation according to a first embodiment of the present invention.
Figure 4:
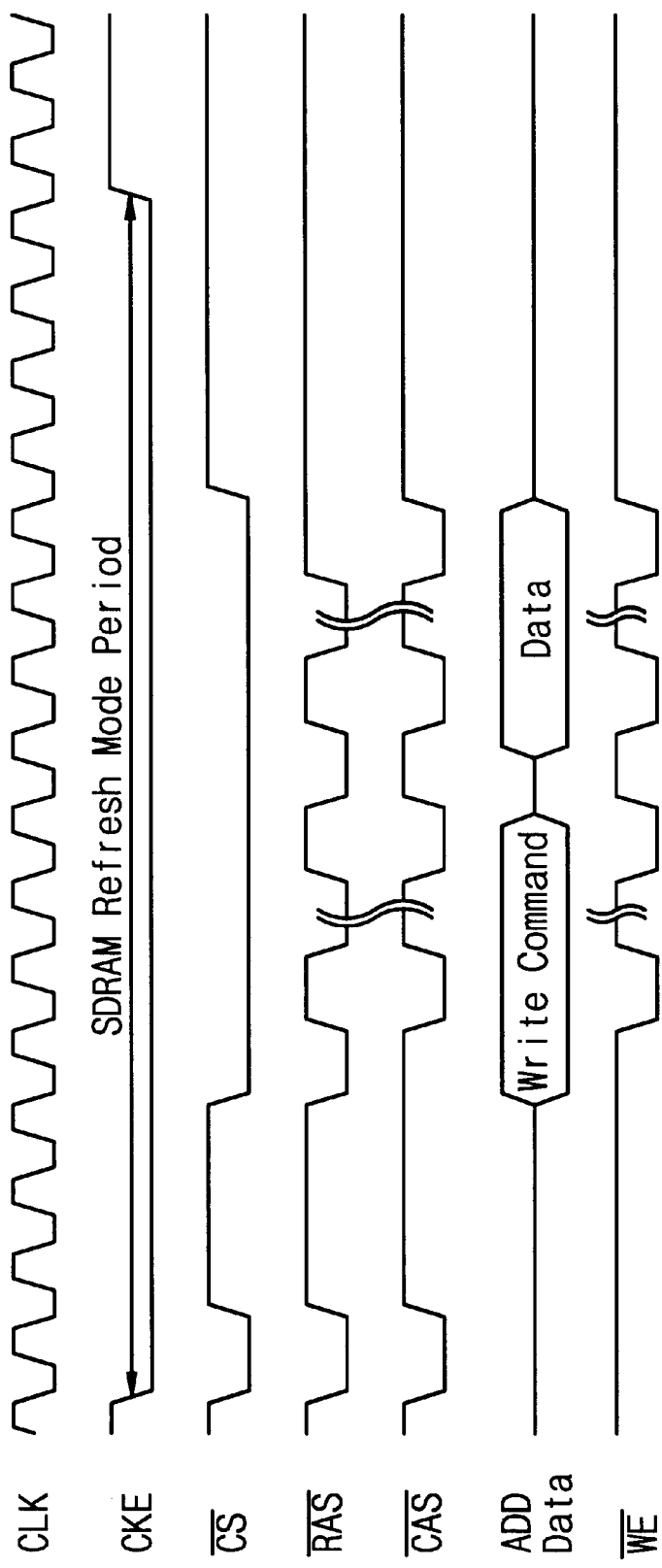
FIG. 4 is a diagram showing the timing between control signals used in a synchronous flash memory device and an SDRAM device during the program operation of the first embodiment.

FIG. 3 is a flowchart for describing a program operation according to a first embodiment of the present invention, and FIG. 4 is a diagram showing the timing between control signals used in a synchronous flash memory device and an SDRAM device during the program operation of the first embodiment.

To program data in the synchronous flash memory device 100, the SDRAM device 200 sharing the system bus 12 is first set to a refresh mode. In particular, the SDRAM device 200 is set to a self refresh mode. Such an operation is performed at step S10 of FIG. 3. Specifically, the SDRAM device 200 enters the refresh mode when a clock enable signal CKE, a chip select signal $\overline{CS}$, a row address strobe $\overline{RAS}$ signal, and a column address strobe $\overline{CAS}$ signal transition from a logic high level to a logic low level at the same time in synchronization with a rising edge of the clock signal CLK. After this, the SDRAM device 200 does not receive externally applied commands until a low-to-high transition of the clock enable signal CKE, that is, when CKE is enabled. While the SDRAM device 200 is in refresh mode, a program operation is performed on the synchronous flash memory device 100 as follows.

In step S12, it is determined whether a write command is input to the synchronous flash memory device 100. If not, step S12 is repeated. Otherwise, the procedure goes to a subsequent step S13, in which data from the exterior is temporarily stored in the latch of the input/output interface 140 or in the latch and control section 150. In a sequent step S14, the temporarily stored data is programmed in addressed EEPROM cells in the same or like manner as the above-described references.

In a next step S15, it is determined whether the program operation in step S14 has been accomplished. If the program operation has not been accomplished, the steps S14 and S15 are repeated until the program operation is accomplished. Otherwise, the procedure goes to step S16, in which the SDRAM device 200 is set to the normal mode from the refresh mode. As illustrated in FIG. 4, as the clock enable signal CKE transitions from a logic low level to a logic high level, the clock signal CLK is supplied to the SDRAM device 200, so that the device 200 operates normally.

According to the first embodiment of the present invention, the SDRAM device 200 enters the refresh mode under the control of the microprocessor 300 before data is programmed into the synchronous flash memory device 100. Therefore, the SDRAM device is not affected by the program operation performed on the synchronous flash memory device.

Second Embodiment

Figure 5:
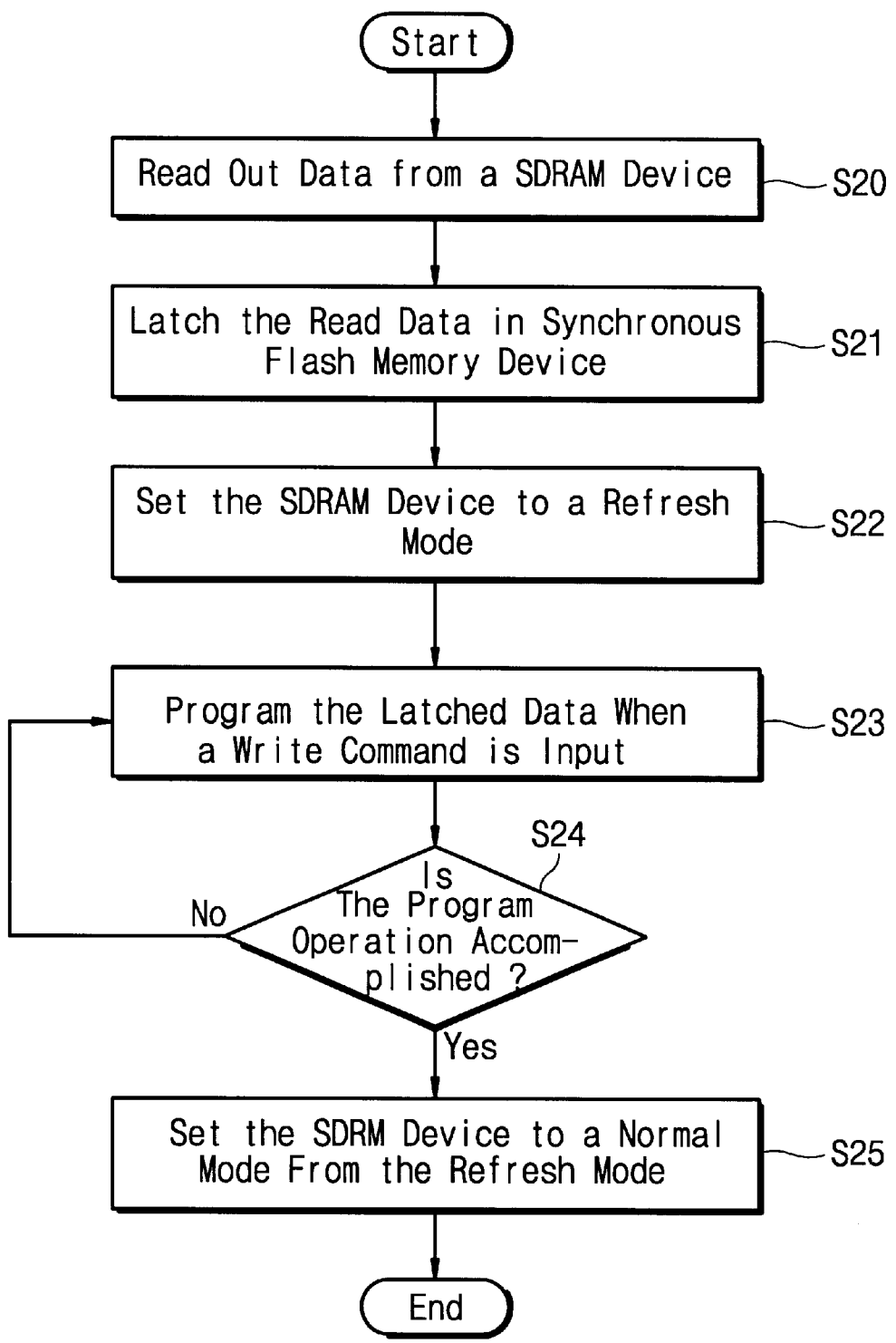
FIG. 5 is a flowchart for describing a program operation according to a second embodiment of the present invention.
Figure 6:
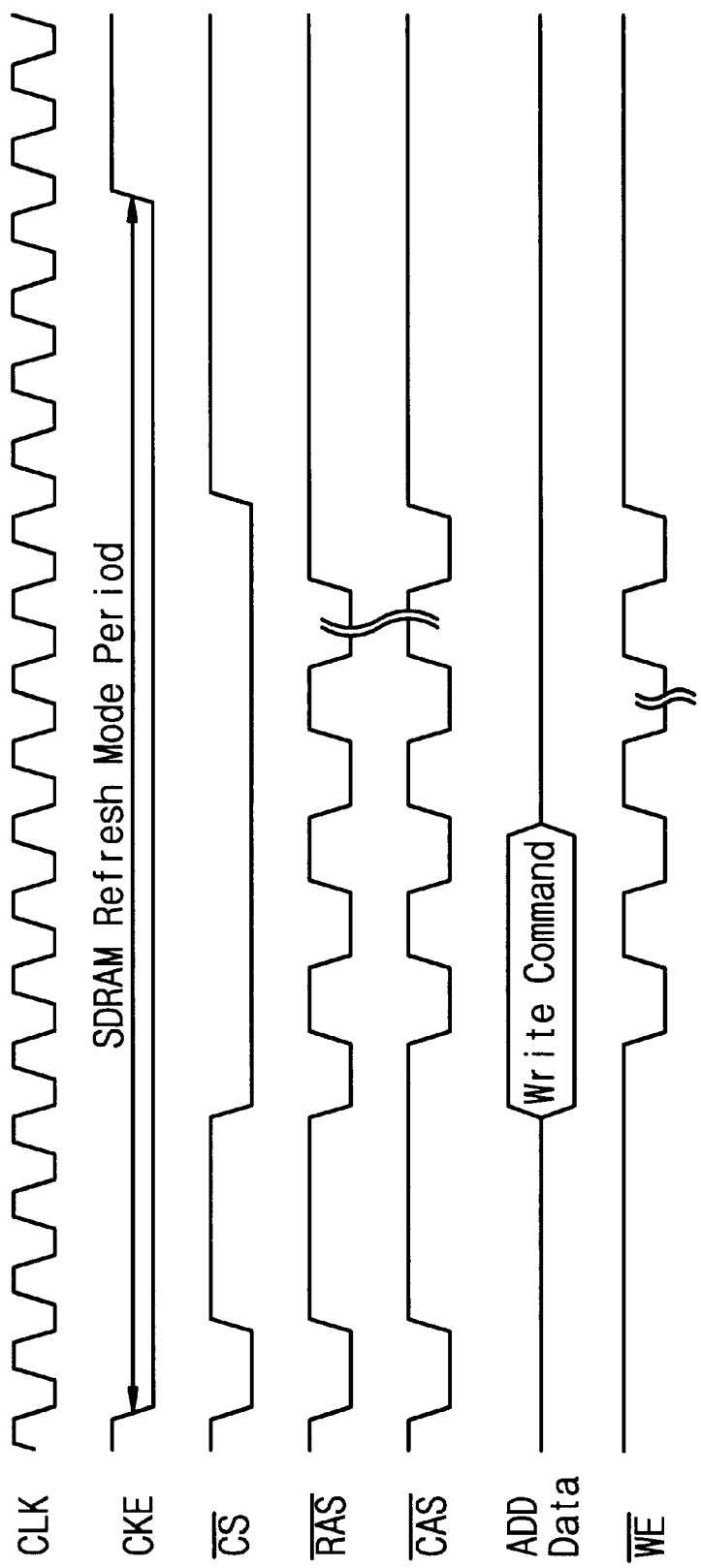
FIG. 6 is a diagram showing the timing between control signals used in a synchronous flash memory device and an SDRAM device during the program operation of the second embodiment.

FIG. 5 is a flowchart for describing a program operation according to the second embodiment of the present invention, and FIG. 6 is a diagram showing the timing between control signals used in a synchronous flash memory device and an SDRAM device during the program operation. The second embodiment relates to the case in which data read out from the SDRAM device 200 is programmed into the synchronous flash memory device 100.

Referring to FIG. 5, in step S20, data stored in the SDRAM device 200 is read out, and is transferred to the data lines of the system bus 12. During step S21, the data transferred via the data lines is then latched in the latch (also referred to as the register) of the input/output interface 140 in the synchronous flash memory device 100. The storage capacity of the latch depends on the storage capacity of the synchronous flash memory device 100, its data input/output organization, and its write procedure.

In a subsequent step S22, the SDRAM device 200 enters the refresh mode (in particular, a self refresh mode) in the same manner as the first embodiment. That is, as illustrated in FIG. 6, the SDRAM device 200 enters the refresh mode when the clock enable signal CKE, the chip select signal $\overline{CS}$, the row address strobe $\overline{RAS}$ signal, and the column address strobe $\overline{CAS}$ signal transition from a logic high level to a logic low level at the same time in synchronization with a rising edge of the clock signal CLK. After this, the SDRAM device 200 does not receive externally applied commands until a low-to-high transition of the clock enable signal CKE. While the SDRAM device 200 is in refresh mode, a program operation is performed on the synchronous flash memory device 100 as follows.

In step S23, the data temporarily stored in the input/output interface 140 is programmed in addressed EEPROM cells in the same or like manner as the above-described references.

In a next step S24, it is determined whether the program operation in step S23 has been accomplished. If the program operation has not been accomplished, then steps S23 and S24 are repeated until the program operation is accomplished. Otherwise, the procedure goes to step S25, in which the SDRAM device 200 is set to normal mode from the refresh mode. As illustrated in FIG. 6, as the clock enable signal CKE transitions from a logic low level to a logic high level, the clock signal CLK is supplied to the SDRAM device 200, so that the device 200 operates normally.

According to the second embodiment of the present invention, the SDRAM device 200 enters the refresh mode under the control of the microprocessor 300 after data read out from the device 200 is transferred to the synchronous flash memory device 100. Therefore, the SDRAM device 200 is not affected by the program operation performed on the synchronous flash memory device.

Third Embodiment

Figure 7:
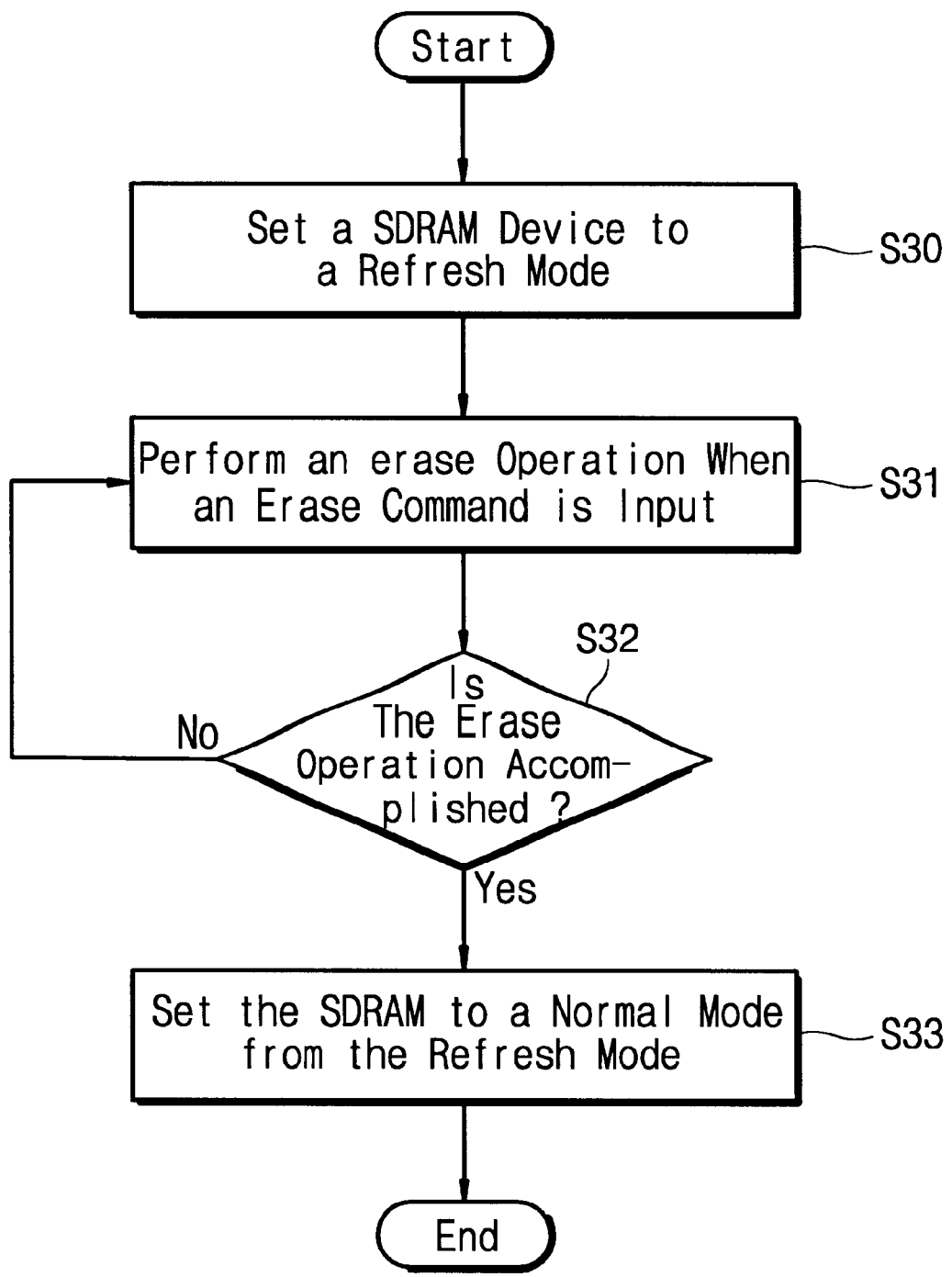
FIG. 7 is a flowchart for describing a program operation according to a third embodiment of the present invention.

FIG. 7 is a flowchart for describing an erase operation according to the third embodiment of the present invention which relates to an erase method for the synchronous flash memory device 100 which shares the system bus 12 with the SDRAM device 200.

To perform an erase operation on the synchronous flash memory device 100, the SDRAM device 200 is first set to a refresh mode as shown in step S30 of FIG. 3. In particular, the SDRAM device 200 enters the refresh mode when the clock enable signal CKE, the chip select signal $\overline{CS}$, the row address strobe $\overline{RAS}$ signal, and the column address strobe $\overline{CAS}$ signal transition from a logic high level to a logic low level at the same time in synchronization with a rising edge of the clock signal CLK. After this, the SDRAM device 200 does not receive externally applied data and commands until a low-to-high transition of the clock enable signal CKE.

In a subsequent step S31, while the SDRAM device 200 is in refresh mode, an erase operation is performed when an erase command is input to the synchronous flash memory device 100. The erase operation can be performed in any known manner such as those in the above-described references.

In step S32, it is determined whether the erase operation in step S31 has been accomplished. If the erase operation has not been accomplished, then steps S31 and S32 are repeated until the erase operation is accomplished. Otherwise, the procedure goes to step S33, in which the SDRAM device 200 is set to a normal mode from the refresh mode. As in the first and second embodiments, the clock signal CLK is supplied to the SDRAM device 200 as the clock enable signal CKE transitions from a logic low level to a logic high level, so that the device 200 operates normally.

According to the third embodiment of the present invention, the SDRAM device 200 enters to the refresh mode under the control of the microprocessor 300 before an erase operation is performed by the synchronous flash memory device 100. Therefore, the SDRAM device is not affected by the erase operation of the synchronous flash memory device.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. In a system comprising a synchronous flash memory device, which shares a system bus with a synchronous dynamic random access memory (SDRAM) device having a refresh mode, a method for performing a programming operation on the synchronous flash memory device comprising the steps of:

setting the SDRAM device to the refresh mode;

programming externally applied data into a memory cell array in the synchronous flash memory device when a program command is input to the synchronous flash memory device and the SDRAM device is in the refresh mode; and setting the SDRAM device to the normal mode from the refresh mode when the programming operation is accomplished.

2. The method according to claim 1, wherein said synchronous flash memory device comprises a plurality of NOR-type electrically erasable and programmable ROMs.

3. The method according to claim 1, wherein said synchronous flash memory device comprises means for receiving an external clock signal, a clock enable signal, a chip select signal, a row address strobe signal, and a column address strobe signal with a latency.

4. The method according to claim 3, wherein said SDRAM enters the refresh mode when the row address strobe signal, the column address strobe signal, and the chip select signal are simultaneously activated, and when a clock enable signal is inactivated.

5. In a system comprising a synchronous flash memory device, which shares a system bus with a synchronous dynamic random access memory (SDRAM) device having a refresh mode, a method for performing a programming operation on the synchronous flash memory device comprising the steps of:

reading data out from the SDRAM device;

latching the data into a latch in the synchronous flash memory device;

setting the SDRAM device to the refresh mode; and programming the latched data into a memory cell array in the synchronous flash memory device.

6. The method according to claim 5, wherein said memory cell array in the synchronous flash memory device comprises a plurality of NOR-type electrically erasable ROMs.

7. The method according to claim 5, further comprising the step of setting the SDRAM device to the normal mode from the refresh mode after the programming step has been completed.

8. The method according to claim 5, wherein said synchronous flash memory device comprises means for receiving an external clock signal, a clock enable signal, a chip select signal, a row address strobe signal, and a column address strobe signal with a latency.

9. The method according to claim 8, wherein said SDRAM device enters the refresh mode when the row address strobe signal and the chip select signal are simultaneously activated and when a clock enable signal is inactivated, and enters the normal mode when the clock enable signal is activated.

10. In a system comprising a synchronous flash memory device, which shares a system bus with a synchronous dynamic random access memory (SDRAM) device having a refresh mode, a method for performing an erase operation on the synchronous flash memory device comprising the steps of:

setting the SDRAM device to the refresh mode;

performing an erase operation on a memory cell array in the synchronous flash memory device in response to an erase command after setting the SDRAM device to the refresh mode; and setting the SDRAM device to the normal mode from the refresh mode after performing the erase operation in the synchronous flash memory device.

11. The method according to claim 10, wherein said memory cell array in the synchronous flash memory device comprises a plurality of NOR-type electrically erasable and programmable ROMs.

12. The method according to claim 10, wherein said synchronous flash memory device comprises means for receiving an external clock signal, a clock enable signal, a chip select signal, a row address strobe signal, and a column address strobe signal with a latency.

* * * * *